United States Patent [19]

Hauser

[11] Patent Number: 4,528,261

[45] Date of Patent: Jul. 9, 1985

[54] PRELAMINATION, IMAGEWISE EXPOSURE OF PHOTOHARDENABLE LAYER IN PROCESS FOR SENSITIZING, REGISTERING AND EXPOSING CIRCUIT BOARDS

[75] Inventor: William P. Hauser, Cranbury, N.J.

[73] Assignee: E. I. Du Pont de Nemours and Company, Wilmington, Del.

[21] Appl. No.: 479,494

[22] Filed: Mar. 28, 1983

[51] Int. Cl.³ ............................................... G03C 5/00
[52] U.S. Cl. .................................... 430/322; 430/311;
    430/327; 430/328; 430/325; 430/394; 430/935
[58] Field of Search ............... 430/394, 260, 281, 270,
    430/322, 327, 328, 311, 325

[56] References Cited

U.S. PATENT DOCUMENTS

| | | | |
|---|---|---|---|
| 3,144,331 | 8/1964 | Themmes | 430/327 |
| 3,629,036 | 12/1971 | Isaacson | 156/241 |
| 3,784,378 | 1/1974 | Gramas | 430/328 |
| 4,291,118 | 9/1981 | Boduch et al. | 430/313 |
| 4,323,636 | 4/1982 | Chen | 430/271 |
| 4,424,089 | 1/1984 | Sullivan | 156/155 |

Primary Examiner—John E. Kittle
Assistant Examiner—José G. Dees

[57] ABSTRACT

Actinic radiation exposes photohardenable material in two steps whereby photohardenable material not present as a solid is exposed through a photomask prior to application to a substrate and in a second step is reexposed through the photomask after application of the material to the substrate.

36 Claims, 13 Drawing Figures

PRELAMINATION, IMAGEWISE EXPOSURE OF PHOTOHARDENABLE LAYER IN PROCESS FOR SENSITIZING, REGISTERING AND EXPOSING CIRCUIT BOARDS

BACKGROUND OF THE INVENTION

There is a continuing need in the printed circuit, graphic arts, and related industries to transfer images photographically from original (positive or negative) photomasks to one or both sides of a light sensitive sheet. In many important cases, these images must be aligned or registered precisely to locations previously established on the element. In the case where images are transferred to both sides of the element, it is often further required that the front and rear images also be registered precisely to each other. In all cases, the photographic operation is carried out in a manner which maintains, to the greatest precision possible, both the definition and the relative locations of the features of the images, while minimizing the transfer of undesired or spurious features.

Printed circuits are often prepared by a repetitive image transfer process using dry film photoresists. The equipment used to practice the photoresist process has consisted in general of discrete pieces such as a cleaner or scrubber for cleaning the copper-clad substrate boards, an oven for preheating the boards, a roll laminator applying heat to the film and board as it laminates them together, an actinic radiation exposure station, and solvent wash-out apparatus for developing a resist image on the copper substrate. Such processes and equipment are fully described in Coombs, "Printed Circuits Handbook", McGraw-Hill Second Edition (1979) and in DeForest, "Photoresist Materials and Processes", McGraw-Hill (1975).

Typically, manual transfer and positioning of the substrate board occurs between each piece of equipment which increases expense and lessens reproducibility, leading to yield loss in the process.

Various attempts have been made to automate the photoresist process but automation has been adopted to only a limited extent. Recently, however, board trimming has been successfully incorporated into an integrated high productivity cleaning and laminating system as disclosed in U.S. Pat. No. 4,293,635, European Patent Application No. 81104013.8, and U.S. Ser. No. 153,636 and U.S. Ser. No. 153,637, both filed May 27, 1980. More recently a high productivity registration and exposure process has been disclosed in U.S. Ser. No. 387,534 filed June 11, 1982. These advances in automation results in substantial cost savings to the user.

A process for coating a photosensitive liquid onto a substrate simultaneously with photomask registration and exposure has been disclosed in U.S. Ser. No. 387,535 filed June 11, 1982. This process is particularly useful for applying permanent coatings to circuit boards before soldering operations. Although excellent protection is obtained for thicker coated layers, similar protection by thinner coated layers is more difficult to accomplish. Since thinner coatings are desirable, a need exists for insuring an adequate coated thickness over the printed circuit pattern.

SUMMARY OF THE INVENTION

The present invention is directed to a process of applying to a substrate and exposing a photohardenable material to obtain discrete areas of photohardened material on the substrate comprising the steps of:
(a) applying to a photomask a layer of photohardenable material which is deformable and which is not present as a solid,
(b) exposing the layer of photohardenable material to actinic radiation through the photomask whereby the surface of the photohardenable material which faces away from the photomask remains deformable;
(c) applying the exposed layer with the photomask to a substrate whereby the surface of photohardenable material which remains deformable faces the substrate:
(d) reexposing the layer containing photohardenable material to actinic radiation through the photomask whereby bonded discrete areas of photohardened material are obtained on the substrate.

A preferred embodiment of the present invention is directed to a process of applying to a sheet substrate and exposing a photohardenable material to obtain discrete areas of photohardened material on the sheet substrate comprising the steps of:
(a) applying to a photomask a layer of photohardenable material which is deformable and which is not present as a solid,
(b) exposing the photohardenable material to actinic radiation through the photomask whereby the surface of the photohardenable material which faces away from the photomask remain deformable and whereby photohardened material and photohardenable material are present in contact with the photomask;
(c) contacting the exposed photohardenable material on the photomask to the substrate whereby during said contacting substantially no movement of the photomask occurs relative to the substrate other than a more intimate contact due to displacement of the photohardenable material and whereby at least one of interfacial or viscous force aids in holding the substrate and photomask in a fixed position relative to one another.
(d) reexposing the layer containing photohardenable material to actinic radiation through the photomask whereby bonded discrete areas of photohardened material are obtained on the substrate.

DETAILED DESCRIPTION OF THE INVENTION

The sheet substrates which are to be coated and imaged according to the teachings of the present invention are varied and depend on the utility of the final article. The substrate may be rigid or flexible, rough or smooth, homogeneous or nonhomogeneous, electrically conductive or nonconductive. The substrate may be coated with photosensitive liquid and imaged on one or both sides and the substrate surface may itself be photosensitive prior to application of the photosensitive liquid.

The process of this invention is useful in providing an adequate consistent thickness of photohardened areas across the face of a sheet substrate coated with an imaged photohardenable liquid. When using photohardenable liquids, the process of this invention is useful for forming high resolution resist images of uniform thickness from photohardenable liquids and has the added advantage of reducing plugging of through-holes by photohardened liquid. The process is particularly useful in forming a permanent mask over a printed circuit pattern in order to protect the circuit during subsequent soldering operations. In this instance the preimaging step insures a minimum thickness of photohardened liquid over the raised circuit pattern which is adequate to protect the pattern during a subsequent solder operation. The process of this invention is also useful in preparing lithographic printing plates with uniform image thickness across the plate surface.

Although this invention is useful for applying photohardenable liquid to one surface of a substrate where alignment of the photomask to the substrate is less critical, e.g., the formation of a single lithographic printing plate or negative photomask, this invention is particularly useful for applying in precise register a photoresist image to both sides of a substrate, e.g., as a "tenting" resist or as a solder mask. Preferred, methods of registering, applying and imaging photohardenable liquids to one or both sides of a substrate are disclosed in assignee's U.S. Ser. No. 387,535 filed June 11, 1980 which is incorporated herein by reference.

In the Figures are shown the process of the invention carried out on one side of a substrate wherein precise registration is important. The substrate is shown in a horizontal orientation, however, it may be held in any orientation including vertical and both sides or surfaces of the substrate can be imaged either concurrently or consecutively.

Figures 1, 1A:
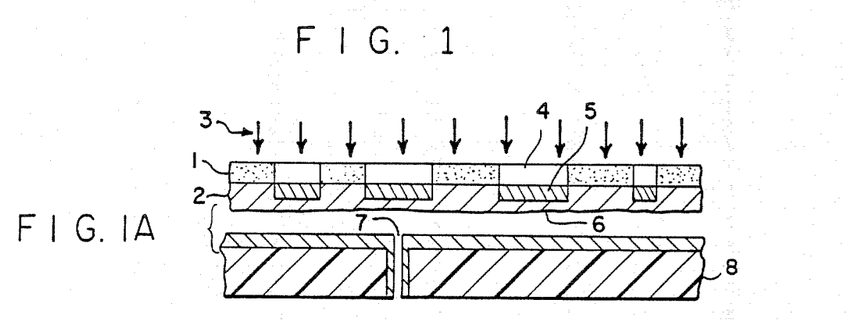
FIG. 1 is a series of drawings depicting process steps for preimaging a photohardenable liquid, applying the preimaged liquid to a substantially uniform surface, reimaging the applied liquid layer, removing unhardened liquid and, optionally modifying uncovered portions of the surface.

FIG. 1 shows a process for forming a printed circuit with plated through-holes using a photohardenable liquid and the preimaging process of this invention.

Referring to FIG. 1A, a photomask (1) having coated thereon a photohardenable liquid layer (2) is exposed to low level actinic radiation (3). Actinic radiation passing through transparent areas (4) of the photomask partially hardens the photohardenable liquid thereunder to form a thin hardened strata (5) of uniform thickness contiguous to the photomask surface and whereby the surface of the photohardenable material which faces away from the photomask (6) remains deformable. The thickness of the strata is only a fraction of the thickness of the photohardenable layer and at least a portion and preferably a half of the thickness of the photohardenable layer remains unhardened on the surface (6) which faces away from the photomask to insure thickness uniformity. The photomask with preimaged photohardenable layer is registered or precisely aligned with plated through-holes (7) of a copper clad substrate (8).

Figure 1B:
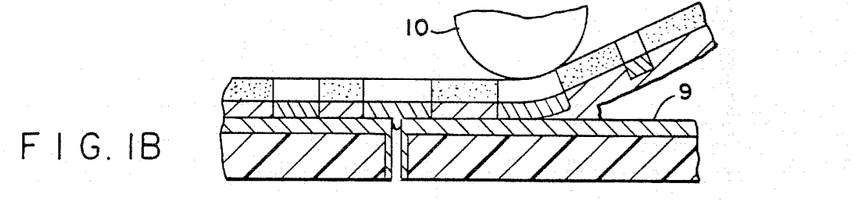
Figure 1C:
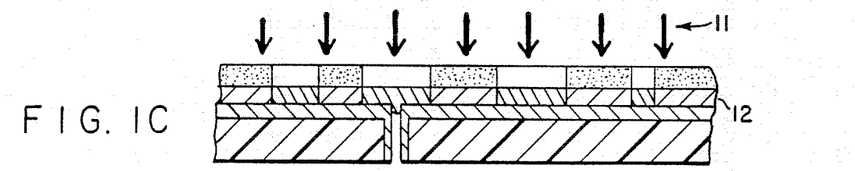
Figure 1D:
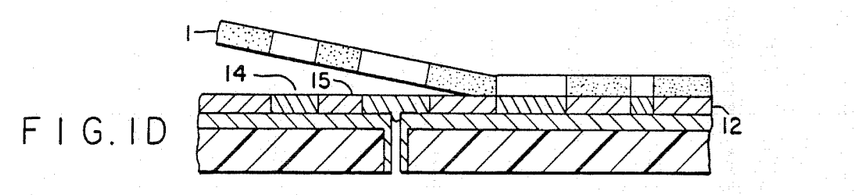
Figure 1E:
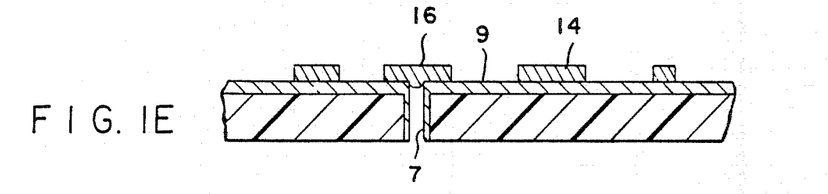

In FIG. 1B, the registered, preimaged, photohardenable layer is applied to the copper surface (9) of the substrate by applying a pressure normal to outer surface of the photomask, as with a pressure roller (10), and advancing the pressure across the mask to form a reigistered preimaged laminate. In FIG. 1C the preimaged photohardenable liquid layer is exposed to high level actinic radiation (11) passing through the transparent areas of the photomask to harden the photohardenable liquid in depth to the copper surface thereunder to form a reimaged layer (12) firmly adhered in register to the copper surface. In FIG. 1D, the photomask (1) is removed from the reimaged layer (12) with no removal of any hardened reimaged areas (14). When the surface of the reimaged layer is subjected to a developer such as a solvent, the unhardened areas (15) are removed to produce a stencil resist image as depicted in FIG. 1E composed of hardened reimage areas (14) on the copper surface. Hardened areas (16) situated over through-holes (7) are referred to as "tents".

Figure 1F:
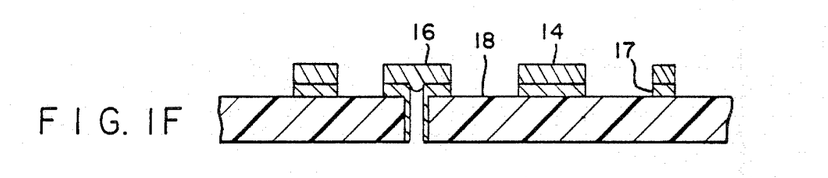
Figure 1G:
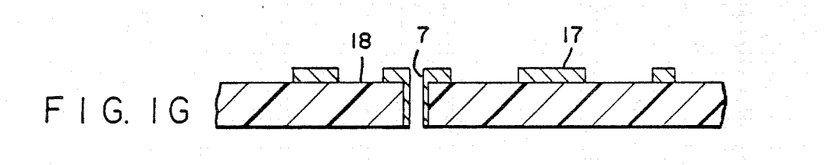

A typical method of using a stencil resist image such as that prepared by the process of this invention is to prepare a printed circuit pattern by etching away all uncovered copper surface areas (9) not protected by the resist image. FIG. 1F shows such an etched circuit pattern (17) on the insulated surface (18) of the substrate. The remaining hardened resist image (14) and (16) is typically removed by a stripping solution to produce the printed circuit pattern of FIG. 1G. Plugging of through-holes with hardened material typically can be a problem when using photohardenable liquids. This problem is reduced using the preimaging process of this invention.

Figures 2, 2A:
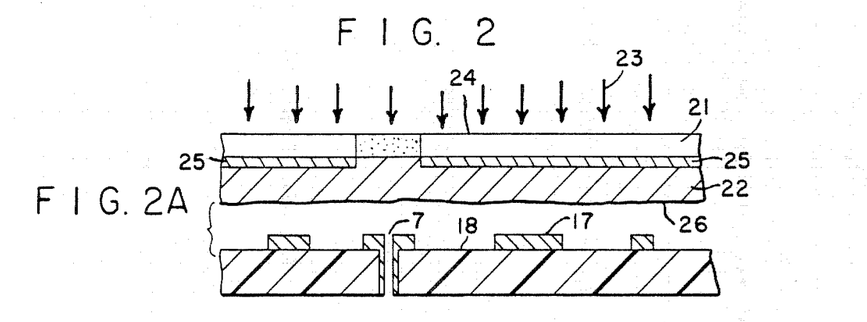
FIG. 2 is a series of drawings depicting process steps for preimaging a photohardenable liquid applying in register the preimaged liquid to a surface having a raised relief pattern, reimaging the applied liquid layer, and removing unhardened liquid.

FIG. 2 shows a process for applying a permanent protective coating, solder mask, to a printed circuit using a photohardenable liquid and the preimaging process of this invention.

Referring to FIG. 2A, a photomask (21) having coated thereon a high viscosity photohardenable liquid layer (22) is exposed to low level actinic radiation (23). Actinic radiation passing through transparent areas (24) of the photomask partially hardens the photohardenable liquid thereunder to form a thin hardened strata (25) of consistent minimum thickness contiguous to the photomask surface. In this instance the thickness of the hardened strata may be a substantial portion of the thickness of the photohardenable layer to insure an adequate protection during soldering. However, at least a portion and preferably a half of the layer thickness remains unhardened and deformable on the surface which faces away from the photomask (26). The photomask with preimaged photohardenable layer is registered or precisely aligned with plated through-holes (7) of a printed circuit pattern (17) described, for instance, in FIG. 1G. In a particularly preferred mode of operation, the printed circuit pattern (17) and insulated surface (18) of the substrate are optionally coated with a low viscosity liquid to reduce or eliminate air entrapment as disclosed below.

Figure 2B:
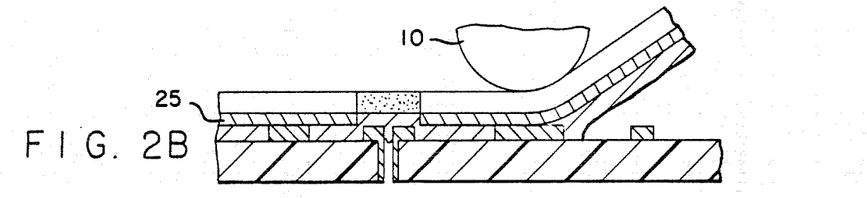

In FIG. 2B, the registered, preimaged, photohardenable layer is applied to the printed circuit pattern by applying a pressure normal to the outer surface of the photomask, as with a pressure roller (10), and advancing the pressure across the mask to form a registered preimaged laminate. During the application, sufficient pressure is needed to insure that all voids formed by the raised circuit relief patterns are filled with photohardenable liquid. The low viscosity liquid, if used, aids in filling the voids. During the application, the thin hardened strata (25) formed by the pre-exposure insures that the raised circuit pattern will be protected by a consistently thick "cap" of photohardened material.

Figure 2C:
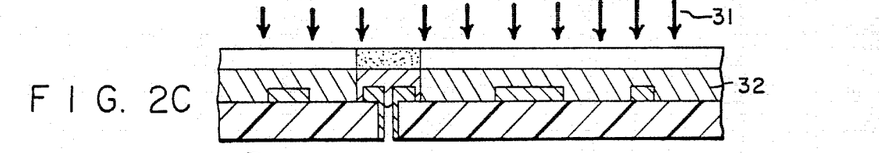
Figure 2D:
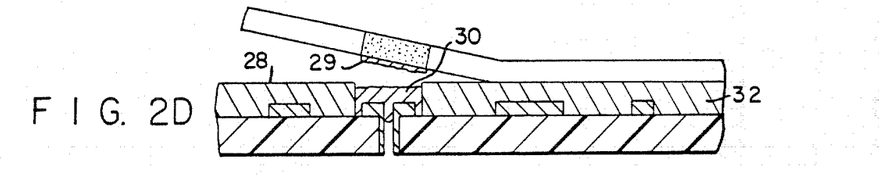

In FIG. 2C the preimaged, photohardenable, liquid layer is exposed to high level actinic radiation (31) passing through the transparent areas of the photomask to harden the photohardenable liquid in depth to the copper and substrate surface thereunder, to form a reimaged layer (32) which encapsulates and firmly adheres to the circuit board. In FIG. 2D, the photomask (21) is removed from the reimaged layer (32) with no removal of any hardened reimage areas (28). In some instances, unexposed photohardenable material (29) may adhere to and be removed with the photomask surface.

Figure 2E:
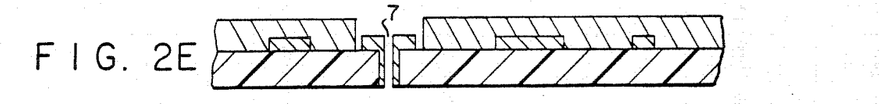

When the surface of the reimaged layer is subjected to a developer, such as a solvent, the unhardened areas (30) are removed to uncover plated through-holes (7) and surrounding "pad" areas. The remainder of the printed circuit pattern is encapsulated in the photohardened material, i.e., solder mask. The encapsulated printed circuit may then be further treated by processes which are commonly used to insert and solder electrical components into the plated through-holes.

Although FIG. 2 has described the formation of a permanent solder mask, it is clear that the process depicted is useful for encapsulating any low relief image to insure minimum protection to raised areas on a permanent or temporary basis.

From the foregoing descriptions of the Figures, it is clear that the extent of preimaging exposure will depend on the utility of the article produced and the type and thickness of the photohardenable liquid layer. In those instances where the substrate surface is relatively smooth and a smooth thin layer (0.0001 to 0.002 inch) of liquid is to be applied, preimaging exposure can be substantial. In such instances a gradient of hardening usually extends throughout the thickness of the layer with the strata nearest the photomask being sustantially hardened with the strata nearest the outer surface being at least deformable under laminating pressure. In those instances where a thick layer (0.001 to 0.005 inch) of liquid is to be applied and the substrate surface is uneven, containing a low relief or stencil, or when the coated liquid layer surface is uneven, exposure can be limited to the strata contiguous to the photomask with virtually no hardening in the outer strata of the layer. Other instances may include in-depth hardening of thick layers or the formation of very thin strata in thin layers depending on the utility desired. The primary criteria for all instances is that the outer strata of the layer remain deformable and photohardenable with the subsequent re-exposure (optionally in the presence of an adhering liquid).

The extent of the hardening gradient within the photohardenable layer will depend on the level of the actinic radiation, the absorbing components in the layer and the thickness of the layer. For any one particular photosensitive layer, the gradient can be adjusted by adjusting the intensity of the actinic radiation, the duration of exposure and/or the spectral character of the radiation. The low level exposure used for preimaging the layer differs from the high level exposure used in reimaging the layer usually in either intensity or duration. Although radiation which is strongly absorbed by layer components is also useful for preimaging and less useful for reimaging.

In the process of this invention either one or a number of sheet substrates in sequence are introduced into a registration and exposure device. The registration portion of the apparatus allows registration of the substrate, generally rectangular, to a photomask in a precise alignment. The photomask allows imagewise exposure of a photosensitive layer to actinic radiation.

The photomask is a flexible sheet which allows actinic radiation to pass. Either one or two photomasks can be used since both sides of the sheet substrate may be imaged in sequence or simultaneously. With two photomasks a leading edge of each can be joined in a parallel, hinged relationship on each side of a thin carrier whose thickness approximates the thickness of the substrate. The photomasks can be maintained in precise register with each other by virtue of their hinged relationship to the common carrier.

With use of two photomasks the substrate is positioned or aligned between the photomasks so one substrate portion is in registration with the carrier and at least one photomask. Registration contact can be simple edge-to-edge contact of the substrate with the carrier wherein the only added criterion is that the desired image pattern of the photomask is completely contained within the area of the sheet to be imaged. However, registration more generally requires the precise alignment of details contained on the substrate with details of the photomask image or images. In this instance at least two contact points on or in the sheet are brought into a fixed relationship with two corresponding contact points fixed to the carrier. Such points may be notches and tabs suitably spaced on the sheet and carrier edges. Alternatively the points may consist of registration pin and hole combinations wherein the sheet contains precision drilled registration holes which are positioned in the desired orientation to the bar by registration pins. With use of a number of substrates the registration is identical from substrate to substrate to obtain a number of substantially identically exposed photosensitive layers on the substrates for subsequent processing.

Once the substrate is in registration relationship to the carrier, the flexible film photomask is applied to at least one side of the substrate in the presence of a preimaged photosensitive liquid interlayer by applying normal pressure in a line roughly parallel to the carrier on the outer surfaces of the photomasks at or near the hinged edges and advancing (relatively) the pressure line in the direction perpendicular to the hinge line and parallel to the substrate surface and, concurrent with the advance, applying the preimaged photosensitive liquid by coating the inner surface of the photomask and exposing the coated layer through the photomask to low level actinic radiation. In effect the nip between the substrate and photomask formed by the advancing linear pressure acts to calender or form a photosensitive interlayer the thickness of which is controlled by the preexposed strata of the coated layer to give a registered sandwich structure in which a preimaged photosensitive layer separates a substrate surface and photomask. With application of preimaged photosensitive liquid on each of the two surfaces of the substrate, this lamination or calendering process step is preferably carried out by passing a hinged photomask-registered sheet assembly through a pair of pressure rollers. The nip pressure is adjusted according to the viscosity of the liquid, the rate of passage of the substrate through the nip, the extent of preexposure, and the layer thickness desired. In this mode of operation, registration is achieved by applying pressure first at or near the hinged leading edge of the substrate and the flexible photomasks with the trailing portions of each photomask wrapped partially around the curved surface of each pressure roll. Photosensitive liquid, preferably photohardenable, is then coated on the surface of the photomask and preexposed therethrough using a low level actinic radiation source. In certain cases the photosensitive liquid is applied to the photomask while a lower viscosity liquid which may also be photosensitive is applied to the substrate. Preferably, the registration apparatus is oriented so that the general direction is upward, i.e., the substrate travels in an upward direction relative to the pressure rolls and liquid applicators. When so oriented, a conditioning or cleaning action of the low viscosity liquid on the substrate can be achieved since excess liquid can be used and will simply drain into a catching basin carrying any extraneous matter with it. In addition, the area above the liquid applicators where actinic exposure preferably occurs can more easily be kept free of unwanted liquid. This process of obtaining alignment of a coated substrate and photomask is generally obtained without assistance of vacuum. It is understood that only one side of the substrate need be coated and a photomask and pressure means need be present only on one side of the substrate.

It is understood that in the present specification "substantially no movement" means that the surface of the substrate and the photomask do not move relative to one another in directions parallel to their surfaces, i.e., the surfaces do not slide relative to one another to change the alignment of the photomask to the substrate. However, it is understood that "substantially no movement" allows relative movement of the photomask and the substrate layer in the direction perpendicular to their surfaces, e.g., as excess unhardened liquid is squeezed from the interface between the substrate and the photomask to form the preimaged photosensitive layer or as the outer strata of the preimaged layer is deformed. However, the substrate layer and photomask, contacted to the preimaged photosensitive layer by the advancing pressure line, remain in a fixed relationship in directions parallel and perpendicular to their surfaces.

Also it is understood in the present specification that "contacting" through the preimaged photosensitive liquid layer a substrate and a photomask does not exclude intermediate layers. For example the substrate could be wetted by a nonphotosensitive liquid prior to application of the photosensitive liquid.

Any method can be used to preexpose the coated photosensitive layer to low level actinic radiation, provided that the preexposure occurs before the coated liquid layer contacts the substrate surface. In one mode of operation wherein the registered photomask and substrate moves into the nip of pressure rollers, the inner surface of the photomask is first coated at an applicator station with a layer of photosensitive liquid. The coated layer is then preimaged as the outer surface of the coated photomask passes an actinic irradiation region situated between the pressure rollers and the applicator station. In this dynamic mode of operation the low level of exposure will be determined by the intensity and spectral character of the irradiation as well as by the rate of transport of the coated mask as it passes the irradiation region. In this mode, the irradiation region may be focused to a band or a transversely scanned spot of intense actinic radiation may be used whose intensity is adjusted to match the exposure characteristics of the photosensitive layer. In another mode of operation, the coated photomask emerges from the applicator station, is stopped and suspended in a fixed position and then exposed through the photomask to a uniform low level of actinic radiation in the 3000 to 4000 Å or above region. In this static mode of operation, the transport of the preimaged coating may then be continued into the nip of the pressure rollers. In another configuration where the applicator station is located between the pressure rollers and the irradiation region and wherein the photomask is transported from the pressure rollers, the inner surface of the photomask is first coated at the applicator station, the coated photomask emerging from the applicator station is stopped and suspended in a fixed position and then exposed through the photomask to uniform low level irradiation. With the applicator station retracted, the direction of transport is reversed and the preimaged coated photomask passes through the pressure rollers in register with the substrate.

Once photomask has been fixed in register over the substrate coated with the preimaged photosensitive liquid interlayer, high level reexposure occurs with any source of radiation actinic to the photosensitive liquid for a prescribed period of time. The radiation source may be the same source as used in preimaging or it may be a different source. The primary criteria is that it is sufficient to carry out high level exposure as defined above. In a preferred mode of operation, the laminated element emerges from the pressure rollers, is stopped and suspended in a fixed upright position and then exposed through a photomask to uniform actinic radiation in the 3000 to 4000 Å or above above region. When both sides of the substrate have photosensitive liquid layers, both sides preferably are exposed simultaneously. In an alternative mode of operation, the photosensitive liquid interlayer is irradiated with actinic radiation as it emerges from the pressure rolls and is carried past the irradiation region. In this mode, the irradiation may be focused to a band or a transversely scanned spot of intense actinic radiation may be used whose intensity is adjusted to match the exposure characteristics of the photosensitive layer and the rate of transport. It is also possible to completely remove the substrate from the registration device and expose it on any suitable exposure unit. The photomasks and carrier remain fixed in registration with the substrate and its photosensitive layer by the action of interfacial or viscous forces induced by the interface liquid. It is understood that both interfacial and viscous forces may be present.

Actinic exposure may induce photoadhesion of the liquid to the photomask depending on the materials from which the photomask is made. To insure easy release of the exposed and hardened liquid, the mask surface can be protected or modified with a thin release layer essentially transparent to actinic radiation. The release layer should have strong adhesion to the mask image surface but have weaker adhesion to the hardened photosensitive liquid. The thickness of the release layer should be minimized, e.g., preferably the thickness of the mask image or less e.g., about 0.001 inch, to insure high resolution of the exposed image. One useful release layer is 0.0005 inch polyethylene terephthalate film adhered to the mask image with an adhesive. Others include various waxes and conventional mold release agents. Desirable features of the photomask include sufficient flexibility to be amenable to the coating/lamination process, dimensional stability in prolonged contact with liquid compositions, chemical stability to liquid compositions ready releasability photopolymer compatibility with release coatings from exposed photopolymer and mechanical durability to stress.

When reimaging exposure is complete, removal of the photomask or photomasks takes place, e.g., by peeling from the surface of the exposed photosensitive layer thus releasing the imaged element from registration. The imaged element is then transferred from the coating-registration-exposure apparatus and the photomask-carrier assembly can be returned to its initial position to receive the next substrate if a series of substrates is to be imaged. In a preferred mode of operation, for a series of substrates, the process steps, for the most part, are reversed after the exposure step. Thus the exposed laminated element passes back through the pressure means such as rollers and each photomask is pulled back over its respective pressure roller into a storage area until the hinged area on the carrier is reached. Other means than rollers may be used to apply pressure, e.g., a squeegee. At or near this point the photomask-carrier assembly stops and the imaged substrate is ejected to a device which conveys the substrate from the coating-registration-exposure apparatus. Also the pressure means may be movable and the apparatus holding the registered substrate with the photomask may be stationary. In such modes of operation the apparatus would be substantially ready to accept the next sheet in the series to be exposed. In the preferred operation after exposure, the motion of the imaged substrate is in a downward direction and the pressure rollers are separated to allow the imaged substrate to drop to the conveying means. The photomasks can be stored in any number of ways as they are peeled from the imaged sheet. One mode of storage is on a take-up drum on which the photomask surface remains free of extraneous contact. Alternatively, the photomasks can be stored suspended in a pre-exposure irradiation region described above. This latter mode of storage is particularly useful for repetitive imaging of substrates.

The sheet substrate during the registration and imagewise exposure process may be in any orientation including horizontal or vertical. Preferably the substrate will be in a vertical or substantially vertical plane. In the process of this invention any means can be used to convey the substrate to and from the registration position in the apparatus. For the preferred mode of operation in an upward-downward direction, the substrate can be conveyed horizontally on its edge by a belt until positioned under the carrier at which point it is elevated into registration contact by a lifting device. After exposure, the imaged sheet is dropped to the conveyor belt which conveys it horizontally on edge out of the apparatus.

The photosensitive liquid which is applied to the photomask is preferably negative working. Negative working liquids would be photohardenable compositions in which the effect of actinic radiation either directly or indirectly hardens or otherwise alters the rheology of exposed image areas. Preferably insolubilization also occurs. Typical photohardening reactions include free-radical chain addition polymerization, crosslinking reactions and dimerization reactions of prepolymers or the like. Such photohardenable compositions are generally disclosed in "Light Sensitive System" by Kosar, John Wiley & Sons, (1965).

The photosensitive liquid generally should possess a viscosity in the unexposed state suitable to form and maintain a continuous layer of uniform thickness between the substrate and the photomask when acted upon by lamination pressure and/or gravitational forces. Due to the preimaging irradiation of this invention lower viscosity liquids may now be used. Thus, optimum liquid viscosity will be influenced by the thickness of the liquid layer, the extent of preimage irradiation, pressure applied in formation of the preimaged liquid interlayer between the substrate and photomask, rate of formation of the preimaged liquid interlayer, temperature and the orientation of the substrate, e.g., vertical vs. horizontal. The lower viscosity limit is set by that viscosity which provides an acceptably thick and stable photosensitive liquid interlayer between the photomask and substrate under the chosen conditions of preimage irradiation, lamination pressure, lamination roll durometer (or contact area), and lamination speed, and application requirements. The upper limit is set by the ability of the equipment to deliver a smooth, uniform coating of adequate thickness to the photomask under the same lamination conditions, as well as the ability of the liquid to conform to the circuitry or raised relief if present without massive entrapment of air or bulk low viscosity liquid.

Preferred negative working photosensitive liquids are photopolymerizable liquids containing at least one monomer which preferably is an addition polymerizable ethylenically unsaturated compounds having one or more terminal ethylenic groups and a free radical generating addition polymerization initiator system activatable by actinic radiation. Generally, the liquids also contain polymeric binders, filler materials and other monomers either alone or in combination to adjust viscosity and other properties of the photosensitive liquid. The liquids may also contain other components such as dyes, pigments, plasticizers, adhesion aids, thermal inhibitors, etc. which may be required for specific uses of the coated article. Examples of useful monomers, initiators, binders and other components are listed below.

Monomers: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, trimethylolpropane triacrylate, pentaerythritol triacrylate, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di(p-hydroxyphenyl)-propane dimethacrylate, di-(3-methacryloxy-2-hydroxypropyl) ether of Bisphenol-A, di-(2-methacryloxyethyl) ether of Bisphenol-A, di-(3-acryloxy-2-hydroxypropyl) ether of Bisphenol-A, di-(2-acryloxyethyl) ether of Bisphenol-A, di-(3-methacryloxy-2-hydroxypropyl) ether of tetrachloro-Bisphenol-A, di-(2-methacryloxyethyl) ether of tetrachloro-Bisphenol-A, di-(3-methacryloxy-2-hydroxypropyl) ether of tetrabromo-Bisphenol-A, di-(2-methacryloxyethyl) ether of tetrabromo-Bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the photohardenable layer can also contain at least one of the following free-radical initiated, chain-propagating, addition polymerizable, ethylenically unsaturated compounds having a molecular weight of at least 300. These monomers include, preferably, an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, which is incorporated by reference, e.g., those having a plurality of addition polymerizable ethylenic linkages, particularly when present as terminal linkages, and especially those wherein at least one and preferably most of such linkages are conjugated with a double bonded carbon, including carbon doubly bonded to carbon and to such hetero atoms as nitrogen, oxygen and sulfur. Outstanding are such materials wherein the ethylenically unsaturated groups, especially the vinylidene groups, are conjugated with ester or amide structures.

Initiators: substituted or unsubstituted polynuclear quinones which are compounds having two intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloroanaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a) anthracene-7,12-dione. Other photoinitiators which are also useful, even though some may be thermally active at temperatures as low as 85° C., are described in Plambeck U.S. Pat. No. 2,760,863 and include vincinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc; α-hydrocarbon substituted aromatic acyloins, including α-methylbenzoin, α-allylbenzoin and α-phenylbenzoin. In addition the photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes may be used. Other suitable polymerization initiators are Michler's ketone, benzophenone 2,4,5-triphenylimidazolyl dimers with hydrogen donors, and mixtures thereof as described in U.S. Pat. Nos. 3,427,161; 3,479,185 and 3,549,367.

All the aforementioned U.S. patents and applications are incorporated by reference.

Binders: Binders can be used individually or in combination or in combination with filler material to adjust viscosity of the photosensitive liquid. Typical binders include: polyacrylate and α-alkyl polyacrylate esters, e.g., polymethyl methacrylate and polyethylmethacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrenes; vinylidene chloride copolymers, e.g., vinylidene chloride/acrylonitrile, vinylidene chloride/methacrylate and vinylidene chloride/vinyl acetate copolymers; polyvinyl chloride and copolymers, e.g., polyvinyl chloride/acetate; high molecular weight polyethylene oxides of polyglycols having average molecular weights of 4000 to 1,000,000; epoxides; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terepthalic, isophthalic and sebacic acids and (ii) terephthalic, isophthalic, sebacic and adipic acids; synthetic rubbers, e.g., butadiene/acrylonitrile, acrylonitrile/butadiene (carboxy-modified, e.g., 3%) acrylonitrile/butadiene/styrene, alkyl (1 to 4 carbon atoms) methacrylate/acrylonitrile/butadiene, alkyl (1 to 4 carbon atoms) methacrylate/styrene/acrylonitrile/butadiene interpolymers, 2-chlorobutadiene/1,3-polymers, chlorinated rubber, styrene/butadiene/styrene, styrene/isoprene/styrene block copolymers and other block copolymers described by Holden et al. in U.S. Pat. No. 3,265,765 which is incorporated by reference, n-butyl methacrylate, polyether polyurethane resin, etc., nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose, polycarbonates; polyvinyl acetal, e.g., polyvinyl butyral, polyvinyl formal; polyformaldehydes.

Fillers: If desired the photopolymerizable layers can also contain immiscible polymeric or nonpolymeric organic or inorganic fillers or reinforcing agents which are essentially transparent at wavelengths used for exposure of the photopolymeric material, e.g., the organofilic silicas, bentonites, silica, powdered glass, colloidal carbon as well as various types of dyes and pigments in amounts varying with the desired properties of the photopolymerizable layers. Particulate thickness disclosed in U.S. Pat. Nos. 3,754,920 and 3,785,817 are useful for this purpose.

Other optional additives include: inhibitors, dyes, pigments, plasticizers, etc.

Suitable thermal polymerization inhibitors include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitroso dimers, e.g., 1,4,4-tri-methyl-2,3,-diazobicyclo-[3.2.2]-non-2-ene-2,3-dioxide, dinitrobenzene, p-toluquinone and chloranil.

Various dyes may be added to increase the visibility of the image formed. Pigments may also be used in this capacity. Any colorant used, however, should preferably be transparent to the actinic radiation used.

Useful plasticizers may be any of the common plasticizers which are compatible with any polymeric binder used, e.g., dialkyl phthalate, polyethylene glycol, and alkyl phosphates.

Although the photosensitive liquid is applied to the photomask for preimaging, the liquid may be applied to both the photomask and substrate. Alternatively, a different photosensitive liquid can be concurrently applied to each surface to produce a resulting layer with a gradient of characteristics. Furthermore, different systems can be applied to the front and back surfaces of the substrate.

In still another embodiment of the invention, the substrate can be treated to a conditioning liquid. Such conditioning liquids may be cleaning or etching solutions which remove dirt or unwanted surface oxides or the like. Such cleaning liquids may be used in conjunction with mechanical cleaning as disclosed in U.S. patent application Ser. No. 153,636 filed May 27, 1980 refiled as U.S. Ser. No. 341,618. The conditioning liquids may be subbing solutions or solutions of adhesion promotors such as disclosed in U.S. Pat. No. 3,645,772. In instances where the photosensitive layer is to be applied to a substrate with a relief surface, e.g., a solder-mask to a circuit board, a conditioning liquid such as a monomer, plasticizer or liquid such as disclosed in U.S. Pat. No. 4,069,076 may be applied to the substrate to eliminate bubble or air entrapment at the relief surface during lamination.

Any means may be used to apply the liquid to the substrate surfaces. The primary requirements for the application means are that they do not damage the surfaces and they do not induce cross-contamination of liquids being applied.

Figure 3:
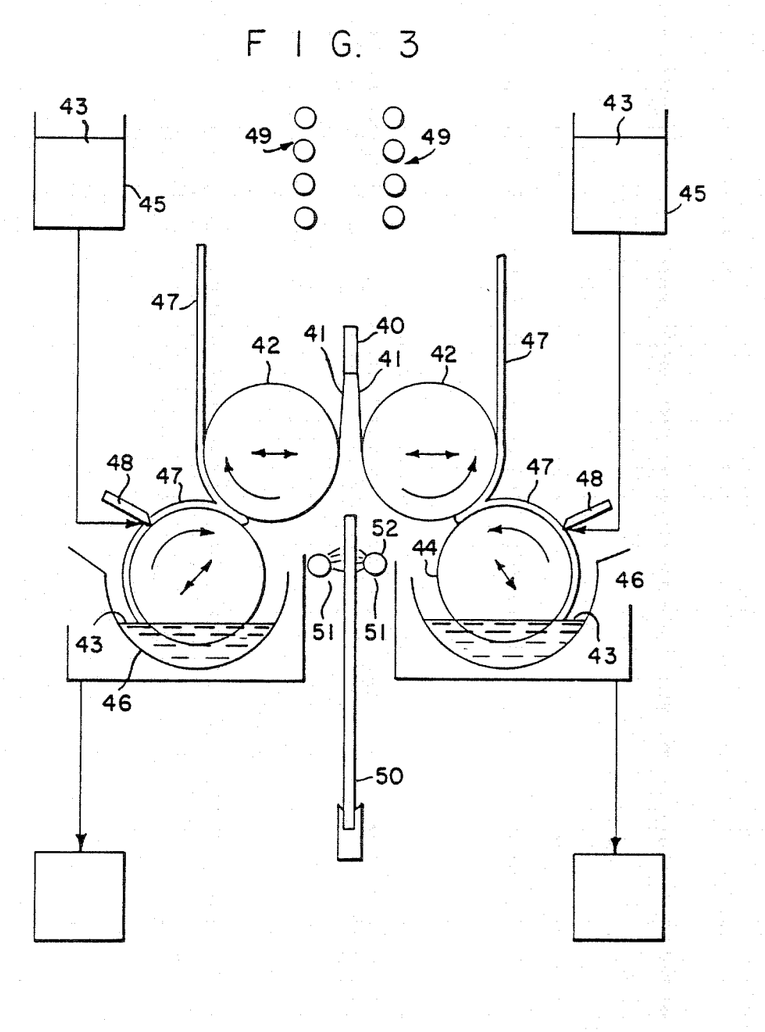
FIG. 3 is a schematic representation of a preferred process of the present invention.

FIG. 3 shows a preferred manner of applying photosensitive liquid to one or both photomasks prior to preimaging and applying the preimaged liquid to one or both sides of a substrate. A carrier bar (40) fixed in register with photomasks (41) moves downward as the photomasks (41) wind around rolls (42) to a suspended position. Photosensitive liquid (43) is applied to applicator rolls (44) from gravity feeders (45) and from feeding pans (46). A layer of photosensitive liquid (47) formed on the applicator rolls (44) by suitable positioning of a doctor knife (48) is transferred to the photomasks (41) as they unwind around rolls (42). When the carrier bar (40) reaches a position between rolls (42), applicator rolls (44) are withdrawn from the surfaces of the photomasks (41) and then the carrier bar with coated photomasks are raised to a position between exposure lamps (49). During the raising, exposure, and subsequent rewind operations, rolls (42) are maintained in a separated position to prevent surface contact of the photosensitive layers (47) to each other. When the carrier bar (40) and photomasks (41) are fixed in position between the exposure lamps (49), the lamps are activated for a prescribed time period to pre-expose the photosensitive layers (47). After preexposure is complete, the carrier bar (40) returns to the position between the rolls (42) and the photomasks (41) rewind to the suspended position. A substrate (50), e.g., a two sided printed circuit board, is raised into registration contact with the carrier bar (40). Either prior to or during the raising operation the surfaces of the substrate (50) may be treated with a low viscosity liquid (51), e.g., using a spray or brush applicator (52). Once registration contact is made, rolls (42) are moved together to provide prescribed lamination pressure and the carrier bar (40) together with the substrate (50), photomasks (41) and preimaged photosensitive layers (47) are raised and maintained in register at the position between the exposure lamps (49). When the registered, laminated composite is fixed in position between the exposure lamps (49), the lamps are activated for a prescribed time period to completely image the photosensitive layers (47). After reexposure is complete, rolls (42) are separated to their original position and the carrier bar (40) is lowered and the photomasks (41) returned to their suspended position thereby ejecting the substrate (50) with photohardened image areas therein. As the imaged substrate is being ejected and the photomasks are wound around rolls (42), the applicator rolls (44) can be engaged and photosensitive layers (47) coated for imaging a subsequent substrate.

The process of this invention is particularly useful in sensitizing and imaging a sequence of similar sheet substrates. Such a repetitive process includes preparation of printed circuit boards from copper clad substrates (known as primary imaging) as well as the application of a permanent masking layer (known as solder mask) to the printed circuit boards prior to soldering. In some particular instances the repetitive process of this invention can be combined with standard dry film resist processes such as that disclosed in U.S. Pat. No. 3,469,982 to produce improved resist images, e.g., such as a "tenting" resist. Thus a sequence of copper clad substrates laminated with a dry film photoresist having superior adhesion properties can be treated by the process of this invention with a photosensitive liquid which would impart superior processing characteristics to the imaged combined resist layer.

The process of this invention is also useful in the graphic arts industry for preparing lithographic printing plates and letterpress printing plates with improved surface characteristics. By coating an aluminum plate with a neat photopolymerizable liquid and imaging using the process of this invention, a lithographic plate can be produced with less labor and time which is more uniform and would have greater wear resistance than litho plates conventionally prepared with liquid. By the process of this invention neat photopolymerizable liquids can be applied to photopolymerizable deep relief printing plates, particularly flexographic plates of the type described in U.S. Pat. No. 4,323,636 to modify printing surface features and/or to correct surface defects produced during manufacture, storage or handling.

EXAMPLE 1

A single side of a printed circuit board is registered, coated with a preimaged photopolymerizable liquid at room temperature and then imagewise exposed using reverse-roll coating of viscous liquid depicted in Example 1 of Assignee's U.S. Ser. No. 387,535 filed June 11, 1982. A viscous photopolymerizable liquid is prepared having the following composition by combining the ingredients in a container and stirring with an air-motor driven, propeller-type stirrer until a homogeneous solution is obtained. Unless otherwise specified, component amounts are given in parts by weight and viscosities are given in poise as determined using a Brookfield viscosometer measured at 25° C. at 6 rpm with spindle No. 5.

| Viscous Photopolymerizable Liquid - A | |
| --- | --- |
| Component | |
| Tripropylene glycol diacrylate | 62.1 |
| Terpolymer of 56% ethylacrylate, 37% methyl methacrylate, and 7% acrylic acid: mol. wt. ca. 260,000, acid no. ca. 76-85, and TG 37° C. | 26.3 |
| Carboset ® 515 acrylic resin - 100% Viscosity 2,000,000 CP, acid No. 63, mol. wt. 7,000, and TG 14° C. | 6.3 |
| Tert-butyl anthraquinone | 1.9 |
| Diethyl hydroxyl amine | 0.2 |
| 2-Mercapto-1,3,4-triazole | 0.2 |
| HVT Green Pigment | 3 |

-continued

| Viscous Photopolymerizable Liquid - A | |
|---|---|
| Component | |
| Liquid viscosity | 857 |

A low viscosity liquid is prepared with the following components:

| Low Viscosity Liquid - AA | |
|---|---|
| Component | Parts by Weight |
| Tripropylene glycol diacrylate | 42 |
| t-Butyl anthraquinone | 2 |
| Epon ® 828 (a liquid epoxy resin of Shell Chemical Co. having an Epoxide equivalent 185-192, a viscosity (Gardner & Holdt) of 100-160 per weight per gal of about 9.7 lbs and a refractive index at 20° C. of 1.573 | 52 |
| Dicyandiamide | 4 |
| 5-Mercaptotriazole | 0.2 |

The above components are mixed with mechanical stirring and then milled with ¼ inch ceramic rods for 24 hours to disperse the sparingly soluble dicyandiamide into the liquid.

The photomask is prepared from a conventional diazo material. The image surface of the photomask is protected by adhering a sheet of Tapcor Emulsion Protection film (Tapcor Inc., Rochester, N.Y.) which is a 0.0005 inch clear polyester film with a 0.0005 inch adhesive layer. Attached in register to the photomask web is a circuit board guide containing registration tabs thereon and having the approximate thickness of the printed circuit board to be imaged.

The protected surface of the photomask is coated with a layer of viscous liquid A by the following procedure. Applicator roll rotating in a clockwise direction picks up liquid from a feeding pan. A metering knife located above the applicator roll surface controls the coating thickness and coating width and with two scrappers at both ends prevents depositing excess liquid banks on the photomask. As the photomask wraps around a second roll in a clockwise direction the photomask's protected surface skims the coated surface of the rotating applicator roll to transfer the coated liquid to the protected surface to give a coated layer about 0.007 inch thick.

The coated photomask is placed in a DMVL-HP exposure source (a product of Colight Inc.) and the photopolymerizable layer is preexposed through the photomask in the presence of air.

A printed circuit board having about 0.003 inch high circuit pattern on one side of a 0.062 inch thick fiberglass epoxy board has on a leading edge registration notches which conform to registration tabs of the circuit board guide. The printed circuit board is dipped into low viscosity liquid "AA" and the liquid is spread over the printed circuit pattern with a brush. After prexeposure the circuit board guide with attached preexposed coated photomask is passed through the nip formed by a pressure roll and the photomask wrapped around the second roll. As the guide passes through the nip the notches of the coated printed circuit board are fitted onto the registraton tabs of the guide so that the printed circuit board is drawn through the nip in register with the image of the photomask. As the board passes through the nip, the coated circuit surface contacts in register the preexposed viscous liquid layer and a preimaged uniformly coated printed circuit board results by squeezing any excess liquid from the nip. The desired thickness of 0.004 inch of resulting coating is obtained by adjusting the speed at which the lamination takes place, and/or the pressure applied by the pressure roll. When the trailing edge of the printed circuit board and photomask passes through the nip, the composite element is removed and is again imagewise exposed through the adhered photomask in the DMVL-HP exposure source to sufficient actinic radiation to harden all exposed areas of the photopolymerizable layer.

After reexposure with actinic radiation is complete, the circuit board is separated from the photomask. The photohardened image separates completely from the protective surface of the photomask and remains firmly adhered to the circuit board surface.

Using the above procedures a series of different pre-exposures and re-exposures were carried out and relative actinic exposures used are tabulated below in arbitrary units.

| Coating # | Pre-exposure | Re-exposure |
|---|---|---|
| 1 | None | 14 |
| 2 | 3 | 14 |
| 3 | 4 | 14 |
| 4 | 6 | 26 |
| 5 | 2 | 53 |

Coating 1 is not pre-exposed and is intended only to demonstrated the level of exposure needed to harden the laminated layer. Immediately after pre-exposure the uncovered surface of each preimaged layer is examined by touch to determine if it is deformable (unhardened) in image area. Each preimaged surface remained tacky (deformable) to the touch. When imaged boards resulting from each of the coatings are inspected no air entrapped bubbles can be detected along circuit lines even by microscopic examination (30×) which can detect bubbles of less than 0.0003 in. Bubble free protective coatings are an important criteria for protective masks used during soldering, i.e., as solder masks. When similar printed circuit boards are coated only with preimaged viscous liquid "A", i.e., no precoating with low viscosity liquid "AA", and reimaged, air entrapment in the form of bubbles are observed along circuit lines perpendicular to the path of coating.

Unhardened liquid remaining on the imaged circuit board is removed in a commercially available ADS-24 processor using 1% $Na_2CO_3$ aqueous solution at 95° F. at a processor speed of 3-4 feet/minute to produce each printed circuit board having a hardened protective coating over the entire circuit pattern except for pad areas corresponding to through-holes in which electrical components are to be soldered. In each case where the coating is pre-exposed, even in instances when only liquid "A" is used, the tops of circuit lines are protected by at least 0.001 inch of hardened photopolymer.

After development the protective coatings are cured by baking the boards for 1 hour in an oven at 300° F. followed by two passes through a commercially available U.V. Cure Apparatus at 10 feet/minute. The circuit board is then ready for conventional finishing, fluxing, inserting electrical components and soldering.

EXAMPLE 2

Both sides of a printed circuit board are registered, coated with a thin layer of preimaged photopolymerizable liquid and then imagewise exposed in an apparatus depicted in FIG. 3.

A viscous photopolymerizable liquid is prepared having the following composition by a method described in Example 1.

| Viscous Photopolymerizable Liquid - B | |
|---|---|
| Component | Parts by Weight |
| Tripropylene glycol diacrylate | 64 |
| Terpolymer of 56% ethylacrylate, 37% methyl methacrylate, and 7% acrylic acid: mol. wt. ca. 260,000, acid no. ca. 76-85, and TG 37° C. | 27 |
| Carboset ® 515 acrylic resin - 100% Viscosity 2,000,000 CP, acid No. 63, mol. wt. 7,000, and TG 14° C. | 6 |
| Tert-butyl anthraquinone | 2 |
| Diethyl hydroxyl amine | 0.2 |
| 3-Mercapto-1,3,4-triazole | 0.2 |
| Dicyandiamide | 0.5 |
| Solvent Red 109 | 0.1 |
| Liquid Viscosity | 800 |

A low viscosity liquid is prepared with the following components by a method described in Example 1.

| Low Viscosity Liquid - BB | |
|---|---|
| Component | Parts by Weight |
| Tripropylene glycol diacrylate | 42 |
| t-Butyl anthraquinone | 2 |
| Epon ® 815 (a liquid epoxy resin of Shell Chemical Co. having an Epoxide equivalent 175-195, (ASTM D-1652) a viscosity 5-7 poises (ASTM D-445) | 53 |
| 3-Mercapto-1,2,4-triazole | 1 |
| Dicyandiamide | 2 |

The photomasks (41) to be used for imaging both sides of each substrate are prepared as in Example 1 with a protective surface and are attached in register to a pin bar registration mechanism (40).

A printed circuit board (50) having about 0.003 inch high circuit pattern on each side of a 0.062 inch thick fiberglass epoxy board and having a pattern of copper plated through-holes in register with the circuit patterns, has on a leading edge two registration holes which conform to registration pins of the pin bar mechanism.

The protected surface of both photomasks are simultaneously coated with a thin layer of viscous liquid "B" by the following procedure. Referring to FIG. 3, initially the pin bar (40) with attached registered photomask (41) is situated in a raised position between the exposure lamps (49) so that the protected surfaces of the photomasks are facing inwards. The trailing portions of the photomasks are each wrapped around a roll (42) and the parallel rolls (42) are in a separated position to prevent contact of the protected surface. As the bar and photomasks move downwards the photomasks unwind around rolls (42), are coated by parallel stainless steel applicator rolls (each about 2.5 inch in diameter) (44) with a layer of viscous liquid (47) and the coated photomasks pass to a suspended position. In the coating procedure, photosensitive liquid "B" (43) is applied to the rotating applicator rolls (44) from gravity feeders (45) and from feeding pans (46). A layer of photosensitive liquid (47) formed on the applicator rolls (44) is controlled in thickness to about 0.007 inch by suitable positioning of doctor knives (48) and is transferred to the protected surfaces of the photomasks (41) as they unwind around rolls (42). When the registration bar (40) reaches a position between rolls (42), applicator rolls (44) are withdrawn from the surfaces of the photomasks (41) and then the registration bar with coated photomasks are raised to the initial position between the exposure lamps. The gap between each doctor knife and the applicator roll is closed, the applicator roll rotation stopped and each applicator roll returned to a position of about 0.002 inch from the surface of each respective photomask. The bar (40) is again moved downwards and each coated photomask unwinds between roll (42) and the stationary applicator roll (44) to a suspended position thereby doctoring each coated layer (47) to a thickness of about 0.002 inch. When the bar (40) again reaches the position between rolls (42), applicator rolls (44) are withdrawn from the doctored layer surface and then the carrier bar with coated photomasks are raised to the initial position between two banks of exposure lamps. (Each bank consists of 10 lamps which are 4 inches from the plane of the photomasks). When fixed in position the coated photomasks are pre-exposed by activating the lamps for 100 seconds. After pre-exposure is complete the carrier registration bar (40) returns to the positon between rolls (42) and the photomasks (41) rewind to the suspended position.

Low viscosity liquid "BB" is brushed to both sides of the printed circuit board (50) and the leading edge of the circuit board is raised into contact with the bar (40) and is registered to the bar by the registration pins of the mechanism. (The pin bar mechanism is similar to that disclosed in Assignee's U.S. Ser. No. 387,534 filed June 11, 1982.) Once registration contact is made rolls (42) are moved together to provide a moderate laminating pressure and the carrier bar (40) together with the circuit board (50) photomasks (41) and preimaged photosensitive layers (47) are raised and maintained in register at the position between the exposure lamps. When the registered laminated composite is fixed in position between the exposure lamps (49), the lamps are activated for 50 seconds which completely images the photosensitive layers. After reexposure is complete, rolls (42) are separated to their original position and carrier bar (40) is lowered and photomasks (41) returned to their suspended position thereby ejecting the circuit board with photopolymerized image areas thereon and no indication of microbubbles in the coated imaged layer.

Unhardened liquid remaining on the imaged circuit board is removed and the protective coating cured as described in Example 1.

A second circuit board with an imaged protective coating is prepared as described above with the exception that the coated photomasks are not preimaged by the 100 second exposure to actinic radiation.

The thickness of hardened polymer over the circuit lines is measured at several locations on both sides of each circuit board prepared using a CMD-3 thickness gauge (a product of UPA Inc., Woodside, NY). The average thickness is given in the following table for each side.

| | Average Polymer Thickness Over Circuit Lines (0.001 inch) | |
|---|---|---|
| | Preimaged Process | Single Exposure Process |
| Side A | 1.38 | 0.78 |
| Side B | 1.14 | 0.76 |

An average polymer thickness of greater than 0.001 inch over circuit lines is normally sufficient to indicate that the circuit board will be adequately protected during subsequent soldering operations. From the above measurements the preimaging process is expected to consistently yield superior solder mask protection when carried out on a repetitive basis even when thin coatings are used.

EXAMPLE 3

A series of similar printed circuit boards are prepared by registering each copper clad substrate and simultaneously coating and imaging both sides of the substrate using the coating and preimaging of the viscous liquid "B" as described in Example 2.

The photomasks to be used for imaging both sides of each substrate are prepared as in Example 1 with a protective surface and are attached in register to a pin bar registration mechanism.

Each copper clad substrate consists of a rectangular fiberglass board, copper clad on both sides and having a pattern of copper plated through-holes in register with two registration holes at one edge of the substrate. Prior to coating, both copper surfaces of each substrate are chemically cleaned and optionally may be sprayed with a surface treating liquid (51) as the substrate is being raised for coating.

The protected surface of both photomasks are simultaneously coated with a 0.002 inch layer of viscous liquid "B" by the coating procedure substantially as described in Example 2 and as in that Example the coated layers are preimaged but in this instance using only a 10 second exposure.

For each coating and imaging cycle the following procedure is followed after preimaging steps are complete. Initially pressure rolls (42) are displaced outward so as to open the nip between the preimaged, coated surfaces on the photomasks and to displace each preimaged surface from the applicator rolls (44) as described in Example 2. The pin bar registration mechanism is displaced in a position above the open nip. The cleaned copper clad substrate is positioned edgewise on a substrate lifting device (not shown) with the uppermost edge containing registration hole aligned with the registration bar. The substrate is raised until it engages the pin bar mechanism which pin registers and grips the substrate. The registered substrate and bar are moved downward just to the open nip and the nip is closed by moving pressure rolls (42) inward to engage the bar-substrate mechanism. The registered substrate and preimaged coated photomasks are then raised through the nip and the coated composite element is suspended in place between two banks of exposure sources.

Sufficient pressure is applied by rolls (42) to produce a uniform coating thickness of 0.001 inch. Both sides of the composite element are irradiated for 100 seconds to U.V. lamps as described in Example 2. Pressure rolls (42) are then displaced to their initial positions and the pin bar mechanism and photomasks return to their initial positions at which point the pin bar mechanism releases the imaged substrate and the substrate is lowered by the lifting device. The imaged substrate is removed for further processing and is replaced by the next substrate to be imaged and the cycle is repeated. During the downward transition after imaging exposure both photomasks are peeled from the imaged photohardened surfaces. Although some unhardened photopolymer adheres to the protective surface of the photomasks all hardened image areas remained firmly adhered to copper substrate surfaces.

As the imaged substrates are removed from the coating and exposure unit, they are developed in an ADS-24 processor using 1% $Na_2CO_3$ aqueous solution at 95° F. at a processor speed of 3 feet/minute to remove any unhardened photopolymerizable liquid remaining on the imaged copper clad substrate. After development the photoresist-protected substrates are processed using conventional plate and etch procedures to produce identical two sided printed circuit boards.

In some instances a liquid containing adhesion promotors such as disclosed in U.S. Pat. No. 3,645,772 are sprayed onto the cleaned copper clad surfaces of the substrate as it is raised past the nozzles (52) to improve final resist adhesion during processing. Similarly adhesion may be improved to the copper surface by spraying with a low viscous solution.

In other instances, a substrate surface cleaning station is put in line with the coating and imaging unit. In this instance, copper clad substrates are fed through the station into the nip of the coating and imaging unit thereby insuring uniformity in the copper surfaces to be coated and producing more consistent quality in the resulting printed circuit boards.

EXAMPLE 4

Both sides of a printed circuit board are registered, coated with a thin layer of preimaged photopolymerizable liquid and then imagewise exposed in an apparatus depicted in FIG. 3.

A viscous photopolymerizable liquid "B" and a low viscosity liquid "BB" are prepared as described in Example 2.

The photomasks (41) to be used for imaging both sides of each substrate are prepared from a conventional diazo material. The image surface of each photomask is protected with 0.001 thick Teflon ® FEP-Fluorocarbon Film, Type C (E. I. du Pont de Nemours and Company). The image side of the photomask is sprayed with a conventional spray adhesive and the treated side of the fluorocarbon film is laminated to the photomask with pressure rolls. The photomasks are attached in register to a pin bar registration mechanism (40) with the protected surfaces facing inward.

A printed circuit board (50) having about 0.003 inch high circuit pattern on each side of a 0.062 inch thick fiberglass epoxy board and having a pattern of copper plated through-holes in register with the circuit patterns, has on a leading edge two registration holes which conform to registration pins of the pin bar mechanism.

The protected surface of both photomasks are simultaneously coated with a thin layer of viscous liquid "B" by the following procedure. Referring to FIG. 3, initially the pin bar (40) with attached registered photomask (41) is situated in a raised position between the exposure lamps (49) so that the protected surfaces of the photomasks are facing inwards. The trailing portions of the photomasks are each wrapped around a roll (42) and the parallel rolls (42) are in a separated position to prevent contact of the protected surface. As the bar and photomasks move downwards the photomasks unwind around rolls (42), are coated by parallel applicator rolls (each about 2.5 inch in diameter) (44) with a layer of viscous liquid (47) and the coated photomasks pass to a suspended position. In this instance each applicator roll (44) consists of an aluminum core with a 0.25 inch thick silicon rubber sleeve having a durometer hardness of 90A. In the coating procedure, photosensitive liquid "B" (43) is applied to the rotating applicator rolls (44) from gravity feeders (45) and from feeding pans (46). A layer of photosensitive liquid (47) formed on the applicator rolls (44) is controlled in thickness to about 0.002 inch by suitable positioning of doctor knives (48) and is transferred to the protected surfaces of the photomasks (41) as they unwind around rolls (42). In this instance each doctor knife consists of stationary stainless steel round bar. When the registration bar (40) reaches a position between rolls (42), applicator rolls (44) are withdrawn from the surfaces of the photomasks (41) and then the registration bar with uniformly coated photomasks are raised to the initial position between two banks of exposure lamps. Each bank consists of 10 lamps which are 4 inches from the plane of the photomasks). When fixed in position the coated photomasks are pre-exposed by activating the lamps for 5 seconds. After pre-exposure is complete the carrier registration bar (40) returns to the position between rolls (42) and the photomasks (41) rewind to the suspended position.

Low viscosity liquid "BB" is brushed across the leading surface of both sides of the printed circuit board (50) and the leading edge of the circuit board is raised into contact with the bar (40) and is registered to the bar by the registration pins of the mechanism. (The pin bar mechanism is similar to that disclosed in Assignee's U.S. Ser. No. 387,534 filed June 11, 1982. Once registration contact is made rolls (42) are moved together to provide a moderate laminating pressure and the carrier bar (40) together with the circuit board (50) photomasks (41) and preimaged photosensitive layers (47) are raised and maintained in register at the position between the exposure lamps. When the registered laminated composite is fixed in position between the exposure lamps (49), the lamps are activated for 30 seconds which completely images the photosensitive layers. After reexposure is complete, rolls (42) are separated to their original position and carrier bar (40) is lowered and photomasks (41) returned to their suspended position thereby ejecting the circuit board with photopolymerized image areas thereon and no indication of microbubbles in the coated imaged layer.

Unhardened liquid remaining on the imaged circuit board is removed and the protective coating cured as described in Example 1.

A second circuit board with an imaged protective coating is prepared as described above with the exception that the coated photomasks are not preimaged by the 5 second exposure to actinic radiation.

The thickness of hardened polymer over the circuit lines is measured at several locations on each circuit board prepared using a CMD-3 thickness gauge (a product of UPA Inc., Woodside, NY). In the instance where the circuit board received only a single imaging exposure of 30 seconds, the thickness of hardened polymer over the circuit lines is 0.0012±0.0002 inch and in the instance where the viscous liquid is preexposed for 5 seconds, the thickness of hardened polymer over the circuit lines is 0.0023±0.001 inch.

The pre-exposure provides a hardened polymer "cap" over the circuit lines which is twice as thick and substantially more uniform than the hardened polymer obtained with a single exposure. In addition to the improved "cap" thickness and uniformity, pre-imaging substantially prevents cross contamination between low viscosity and high viscosity liquids, thereby insuring the formation of a two strata photoresist.

What is claimed is:

1. A process of applying to a substrate and exposing a photohardenable material to obtain discrete areas of photohardened material on the substrate comprising the steps of:
   (a) applying to a flexible photomask a photohardenable material which is deformable and which is not present as a solid with said material applied in excess compared to the amount necessary to form a layer in step (c);
   (b) exposing a portion of the photohardenable material to actinic radiation through the photomask whereby the surface of the photohardenable material which faces away from the photomask remains deformable;
   (c) applying exposed and unexposed material with the photomask to a substrate to form a layer whereby the surface of photohardenable material which remains deformable faces the substrate by applying pressure to the flexible photomask and advancing the pressure to remove excess photohardenable material between the photomask and substrate to form a registered preimaged laminate; and
   (d) reexposing the layer containing photohardenable material to actinic radiation through the photomask whereby bonded discrete areas of photohardened material are obtained on the substrate.

2. The process of claim 1 wherein the photohardenable material is a photosensitive liquid.

3. The process of claim 1 wherein the substrate surface is substantially smooth.

4. The process of claim 1 wherein the substrate surface contains raised portions.

5. The process of claim 4 wherein the raised portions are electrically conducting.

6. The process of claim 4 wherein the raised portions are electrically insulating.

7. The process of claim 1 wherein the photohardenable material is negative working.

8. The process of claim 1 wherein a low viscosity liquid is applied to the substrate before step (c).

9. The process of claim 1 wherein the photohardenable material contains an addition photopolymerizable component.

10. The process of claim 1 wherein after step (d), the photomask is removed from the surface of the exposed photohardenable material and developer is applied to the surface of the photohardened material whereby unexposed unhardened discrete areas are removed.

11. The process of claim 1 wherein in step c the exposed layer is applied in precise register with the substrate.

12. The process of claim 1 wherein the application of photohardenable material is applied to a substrate surface held in a substantially vertical plane.

13. The process of claim 1 wherein excess photohardenable material is drained.

14. The process of claim 1 wherein the pressure is applied by use of pressure rollers.

15. The process of claim 1 wherein in addition to a first set of steps (a), (b), (c) and (d) a second set of steps (a), (b), (c) and (d) is performed in conjunction with a second photomask whereby discrete areas of photohardenable material are obtain on opposite surfaces of the substrate with said opposite substrate surfaces maintained without change of orientation throughout the combination of the first and second sets of steps.

16. The process of claim 15 wherein the sets of steps are performed concurrently.

17. A process of applying to a substrate and exposing a photohardenable material to obtain discrete areas of photohardenable material on the sheet substrate comprising the steps of:
  (a) applying to a flexible photomask a photohardenable material which is deformable and which is not present as a solid with said material applied in excess compared to the amount necessary to form a layer in step (c);
  (b) exposing the layer of photohardenable material to actinic radiation through the photomask whereby the surface of the photohardenable material which faces away from the photomask remain deformable and whereby photohardened material and photohardenable material are present in contact with the photomask;
  (c) contacting exposed and unexposed material on the photomask to the substrate to form a layer whereby during said contacting substantially no movement of the photomask occurs relative to the substrate other than a more intimate contact due to displacement of the photohardenable material and whereby at least one of interfacial or viscous force aids in holding the substrate and photomask in a fixed position relative to one another by applying pressure to the flexible photomask and during the contacting excess photohardenable material is removed between the photomask and substrate to form a registered preimaged laminate; and
  (d) reexposing the layer containing photohardenable material to actinic radiation through the photomask whereby bonded discrete areas of photohardened material are obtained on the substrate.

18. The process of claim 17 wherein the photohardenable material is a photosensitive liquid.

19. The process of claim 17 wherein the substrate surface is substantially smooth.

20. The process of claim 17 wherein the substrate surface contains raised portions.

21. The process of claim 20 wherein the raised portions are electrically conducting.

22. The process of claim 20 wherein the raised portions are electrically insulating.

23. The process of claim 17 wherein the photohardenable material is negative working.

24. The process of claim 20 wherein a low viscosity liquid is applied to the substrate before step (c).

25. The process of claim 17 wherein the photohardenable material contains an addition photopolymerizable component.

26. The process of claim 17 wherein after step (d), the photomask is removed from the surface of the exposed photohardenable material and developer is applied to the surface of the photohardened material whereby unexposed unhardened discrete areas are removed.

27. The process of claim 17 whereby photo hardenable material between the substrate and the photomask is displaced and the substrate and photomask are brought into more intimate contact by an advancing nip.

28. The process of claim 17 wherein the application of photohardenable material is to a substrate surface held in a substantially vertical plane.

29. The process of claim 17 wherein the application of photohardenable material is to a substrate surface held in a substantially horizontal plane.

30. The process of claim 17 wherein the photohardenable material between the substrate and photomask is displaced when the substrate and photomask are brought into more intimate contact by an advancing line pressure.

31. The process of claim 30 wherein said advance line pressure employs a nip.

32. The process of claim 17 wherein in step c the exposed layer is applied in precise register with the substrate.

33. The process of claim 17 wherein excess photohardenable material is drained.

34. The process of claim 17 wherein the pressure is applied by use of pressure rollers.

35. The process of claim 17 wherein in addition to a first set of steps (a), (b), (c) and (d) a second set of steps (a), (b), (c) and (d) is performed in conjunction with a second photomask whereby discrete areas of photohardenable material are obtained on opposite surfaces of the substrate with said opposite substrate surfaces maintained without change of orientation throughout the combination of the first and second sets of steps.

36. The process of claim 35 wherein the sets of steps are performed concurrently.

* * * * *

UNITED STATES PATENT AND TRADEMARK OFFICE
CERTIFICATE OF CORRECTION

PATENT NO. : BI 4,528,261

DATED : November 22, 1988

INVENTOR(S) : William P. Hauser

It is certified that error appears in the above-identified patent and that said Letters Patent is hereby corrected as shown below:

On the title page, Item [45] "Nov. 15, 1988" should read

-- Nov. 22, 1988 --.

Signed and Sealed this

Sixth Day of December, 1988

*Attest:*

DONALD J. QUIGG

*Attesting Officer*     *Commissioner of Patents and Trademarks*

REEXAMINATION CERTIFICATE (950th)

United States Patent [19]

Hauser

[11] B1 4,528,261

[45] Certificate Issued    Nov. 15, 1988

[54] PRELAMINATION, IMAGEWISE EXPOSURE OF PHOTOHARDENABLE LAYER IN PROCESS FOR SENSITIZING, REGISTERING AND EXPOSING CIRCUIT BOARDS

[75] Inventor: William P. Hauser, Cranbury, N.J.

[73] Assignee: E. I. Du Pont de Nemours and Company, Wilmington, Del.

Reexamination Request:
No. 90/000,977, Mar. 31, 1986

Reexamination Certificate for:
Patent No.: 4,528,261
Issued: Jul. 9, 1985
Appl. No.: 479,494
Filed: Mar. 28, 1983

[51] Int. Cl.⁴ .................................. G03C 5/00
[52] U.S. Cl. .................... 430/322; 430/311; 430/327; 430/328; 430/325; 430/394; 430/935
[58] Field of Search ............. 430/311, 322, 325, 319, 430/326

[56] References Cited

U.S. PATENT DOCUMENTS

| | | | |
|---|---|---|---|
| 2,760,863 | 8/1956 | Plambeck, Jr. | |
| 3,144,331 | 8/1964 | Thommes | 430/327 |
| 3,629,036 | 12/1971 | Isaacson | 156/241 |
| 3,784,378 | 1/1974 | Gramas | 430/328 |
| 3,837,887 | 9/1974 | Akamatsu et al. | 117/34 |
| 3,948,657 | 4/1976 | Yoshikawa et al. | 156/90 X |
| 4,159,176 | 6/1979 | de Masi | 355/79 |
| 4,260,675 | 4/1981 | Sullivan | 430/315 |
| 4,291,118 | 9/1981 | Boduch et al. | 430/313 |
| 4,323,636 | 4/1982 | Chen | 430/271 |
| 4,424,089 | 1/1984 | Sullivan | 156/155 |
| 4,506,004 | 3/1985 | Sullivan | 430/312 |
| 4,544,626 | 10/1985 | Sullivan | 430/311 |
| 4,556,627 | 12/1985 | Sullivan | 430/312 |

OTHER PUBLICATIONS

DeForest, "Photoresist Materials and Processes", 1975, pp. 20–32.

*Primary Examiner*—Roland E. Martin, Jr.

[57]      ABSTRACT

Actinic radiation exposes photohardenable material in two steps whereby photohardenable material not present as a solid is exposed through a photomask prior to application to a substrate and in a second step is reexposed through the photomask after application of the material to the substrate.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–36 is confirmed.

New claims 37–40 are added and determined to be patentable.

*37. The process of claim 1 wherein in addition to photohardenable material applied to the flexible photomask in step (a), photohardenable material is also applied to the substrate.*

*38. The process of claim 37 wherein the photohardenable material applied to the photomask and substrate is of the same composition.*

*39. The process of claim 17 wherein in addition to photohardenable material applied to the flexible photomask in step (a), photohardenable material is also applied to the substrate.*

*40. The process of claim 17 wherein the photohardenable material applied to the photomask and substrate is of the same composition.*

* * * * *